(12) United States Patent
Jung et al.

(10) Patent No.: US 6,316,162 B1
(45) Date of Patent: Nov. 13, 2001

(54) POLYMER AND A FORMING METHOD OF A MICRO PATTERN USING THE SAME

(75) Inventors: Jae Chang Jung; Myoung Soo Kim; Hyung Gi Kim; Chi Hyeong Roh; Geun Su Lee; Min Ho Jung; Cheol Kyu Bok; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/301,945

(22) Filed: Apr. 29, 1999

(30) Foreign Application Priority Data

Apr. 30, 1998 (KR) .................................................. 98-16221

(51) Int. Cl.$^7$ ................................. G03F 7/38; G03C 5/56
(52) U.S. Cl. ...................... 430/291; 430/270.1; 430/330; 430/905
(58) Field of Search .................................. 430/291, 905, 430/230, 270.1

(56) References Cited

U.S. PATENT DOCUMENTS

| | | | |
|---|---|---|---|
| 3,370,047 | 2/1968 | Raines | 260/78.5 |
| 4,011,386 | 3/1977 | Matsumoto et al. | |

(List continued on next page.)

FOREIGN PATENT DOCUMENTS

| | | |
|---|---|---|
| 0071571 | 7/1982 | (EP) . |
| 0789278A2 | 2/1997 | (EP) . |

(List continued on next page.)

OTHER PUBLICATIONS

Abstract J. Photopolym. Sci. Technol., 10(4), 529–534 (1997).
Abstract. Jpn. J. Appl. Phys., Part 1, 37 (12B), 6888–6893 (1998).
Thomas I. Wallow, et al., "Evaluation of Cycloolefin–Maleic Anhydride Alternating Copolymers as Single–Layer Photoresist for 193nm Photolithography", 1996, Proc. SPIE, vol. 2724, 355–364.

(List continued on next page.)

Primary Examiner—John S. Chu
(74) Attorney, Agent, or Firm—Townsend and Townsend and Crew LLP

(57) ABSTRACT

The present invention relates to a polymer represented by following Formula 1 and a method of forming a micro pattern using the same:

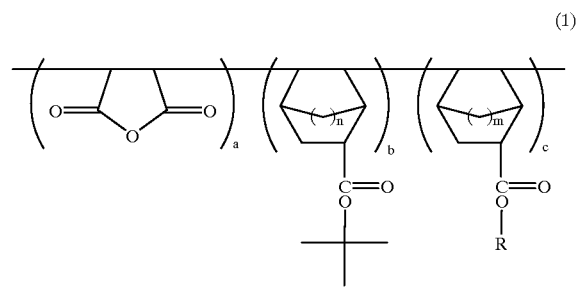

(1)

wherein, R is $C_1$–$C_{10}$ primary or secondary alcohol group; m and n independently represent a number from 1 to 3; and the ratio a:b:c is (10–80)mol %:(10–80)mol %:(10–80)mol %, respectively.

The photoresist polymer according to the present invention is suitable for forming an ultra-micro pattern such as used in 4G or 16G DRAM semiconductor devices using a light source such as ArF, an E-beam, EUV, or an ion-beam.

7 Claims, 11 Drawing Sheets

U.S. PATENT DOCUMENTS

| | | | |
|---|---|---|---|
| 4,106,943 | 8/1978 | Ikeda et al. | |
| 4,491,628 | 1/1985 | Ito et al. | 430/176 |
| 4,883,740 | 11/1989 | Schwalm et al. | 430/270 |
| 5,087,677 | 2/1992 | Brekner et al. | 526/160 |
| 5,212,043 | 5/1993 | Yamamoto et al. | 430/192 |
| 5,252,427 | 10/1993 | Bauer et al. | 430/270 |
| 5,278,214 | 1/1994 | Moriya et al. | |
| 5,585,219 | 12/1996 | Kaimoto et al. | 430/270.1 |
| 6,132,926 | 10/2000 | Jung et al. | 430/270.1 |

FOREIGN PATENT DOCUMENTS

| | | |
|---|---|---|
| 794458 | 9/1997 | (EP) . |
| 0836119A1 | 11/1997 | (EP) . |
| 1342112 | 5/1970 | (GB) . |
| 1329997 | 9/1970 | (GB) . |
| 2320717 | 6/1997 | (GB) . |
| 2320501A | 12/1997 | (GB) . |
| 2320718A | 12/1997 | (GB) . |
| 2321060 | 1/1998 | (GB) . |
| 2 320 501 | 6/1998 | (GB) . |
| 2 320 717 | 7/1998 | (GB) . |
| 2 320 718 | 9/1998 | (GB) . |
| 04099967 | 4/1992 | (JP) . |
| 10316720 | 2/1998 | (JP) . |
| 128164 | 2/1977 | (NL) . |
| WO 96/37526 | 11/1996 | (WO) . |
| WO 97/33198 | 9/1997 | (WO) . |

OTHER PUBLICATIONS

R.D. Allen et al., "The Influence of Photoacid Structure on the Design and Performance of 193nm Resists", 1997, Journal of Photopolymer Science and Technology, vol. 10, 503–510.

F.M. Houlihan et al., "A Commercially Viable 193nm single Layer Resist Platform", 1997, Journal of Photopolymer Science and Technology, vol. 10, 511–520.

J.C. Jung et al., "ArF Single Layer Resist Composed of Allicyclic Main Chain Containing Maleic Anhydride", 1997, Journal of Photopolymer Science and Technology, vol. 10, 529–533.

S. J. Choi et al., "New ArF Single–layer Resist for 193–nm Lithography", 1997, Journal of Photopolymer Science and Technology, vol. 10, 521–528.

T. Hattori et al., "Synthesis and Dissolution Characteristics of Novel Alicyclic Polymer With Monoacid Ester Structures". 1997, Journal of Photopolymer Science and Technology, vol. 10, 535–544.

K. Nozaki and Ei Yaro, "New Protective Groups in Methacrylate Polymer for 193–nm Resists", 1997, Journal of Photopolymer Science and Technology, vol. 10, 545–550.

K. Nakano et al., "Chemically Amplified Resist Based on High Etch–Resistant Polymer for 193–nm Lithography", 1997, Journal of Photopolymer Science and Technology, vol. 10, 561–569.

Alexander A. Dobrev, Emile Perez, Jean Claud Ader, Armand Lattes, "First Application of Functionalized in the Ester Moiety Acrylates in Diels–Alder Reaction: Invluence of Solvents on Stereochemistry"; Bulgarian Chemical Communications, vol. 28, No. 2 (1995) pp. 253–258.

T.P. McGovern and C.E. Schreck, "Mosquito Repellents: Monocarboxylic Esters of Aliphatic Diols", Journal of the American Mosquito Control Association, vol. 4, No. 3, pp. 314–321.

CA Register No. 100207–98–5.

CA Register No. 32759–57–2.

CA Register No. 27056–70–8.

CA Register No. 174659–58–6.

CA Register No. 28503–41–5.

CA Register No. 194997–59–6.

CA Abstract No. 104:149512 & Macromolecules 19(4) 1266–8 (1986).

CA Abstract No. 91:124064 & Makromol. Chem. 180(8) 1975–88 (1979).

CA Abstract No. 113:24734 & JP 02 051511.

CA Abstract No. 127:227269 & J Photopolym. Sci. Technol. 10(4) 529–534 (1997).

CA Abstract No. 124:317926 & Marcomol. Rapid Commun. 17(3) 173–180 (1996).

CA Abstarct No. 124:203171 & Macromolecules 29(8) 2755–63 (1996).

CA Abstract No. 127:227308 & Proc. SPIE–Int. Soc. Opt. Eng. (1997) 3049 Advances in Resist Technology and Processing XIV 92–103.

CA Abstract No. 66:18889 & Magy. Kem. Foly. (1966) 72(11)491–3.

CA Abstract No. 199328–07–9.

POLYMER AND A FORMING METHOD OF A MICRO PATTERN USING THE SAME

BACKGROUND OF THE INVENTION

The present invention relates to a polymer useful as a photoresist in a lithographic process for fabricating a semiconductor device, and a method of forming a micro pattern using the same. More specifically, the present invention relates to a polymer which can be used in a photoresist composition for forming an ultra-micro pattern in the manufacture of 4G and 16G DRAM semiconductor chips using short wavelength light sources, such as KrF (248 mn), ArF (193 nm), an E-beam, or an ion-beam. The polymer of the present invention is particularity useful in a photoresist composition for the top surface image (TSI) process using silylation.

In the manufacturing process of a semiconductor element, a photoresist is generally used to form a pattern with a fixed form on a semiconductor element. To obtain the desired photoresist pattern, a photoresist solution is coated on a surface of a semiconductor wafer, the coated photoresist is exposed to patterned light, and then the wafer undergoes a developing process. As a result, a photoresist pattern is formed on the wafer.

If the photoresist pattern is manufactured using a conventional silylation process, the photoresist is usually composed of diazonaphtoquinones compounds and a novolac resin, or a photo acid generator and polyvinyl phenol resin. When the photoresist resin is exposed to the patterned light source (e.g. ArF, KrF, or I line) and then baked, an alcohol group (R—O—H) is formed in the resin at the exposed regions. After baking, the photoresist resin is silylated with a silylation agent such as hexamethyl disilazane or tetramethyl disilazane. In the silylation process, an N—Si bond is first formed, but since the N—Si bond is weak, it then reacts with the R—O—H group in the photoresist polymer to form a R—O—Si bond. The photoresist resin with bonded silicon atoms then undergoes a dry developing using $O_2$ plasma to form a silicon oxide film. The lower portions of the silicon oxide film remain even after the development of the photoresist and as a result, the desired pattern is formed.

The above-described silylation process for forming a photoresist pattern has several deficiencies when it is used with shorter wavelength radiation. In particular, when a KrF eximer laser is used as the light source to expose known photoresist polymers, it is impossible to form an ultra-micro pattern less than 0.10 $\mu$m L/S using the silylation process. When an ArF light source is used, the lens of the exposer can be damaged due to the high energy level of the ArF light. Therefore, the photoresist must be exposed to a lower amount of energy, for example, less than 10 $mJ/cm^2$. If the photoresist is not exposed sufficiently to this lower energy, the desired pattern is not formed.

SUMMARY OF THE INVENTION

It has been found that the unique photoresist polymers of the present invention solve the above-described problems of the prior art. The heat-resistant character of the polymers of this invention allow the high temperatures required by the post-exposure baking and silylation steps of the TSI process to be obtained. The polymers of the present invention are particularity suited for use in chemically amplied photoresists wherein a photoresist pattern can be resolved even using a small amount of energy (e.g., 10 $mJ/cm^2$), thereby preventing the damage to the lens of the exposer and the photoresist pattern collapse or insufficient resolution which occurs in the prior art during the formation of the micro pattern using an ArF (193 nm) light source. In addition, the polymers of the present invention are advantageously used in the silylation process wherein a chemically amplified photoresist and $O_2$ plasma are used to form a silicon oxide film which increases the etching and heat resistance of the photoresist such that an acceptable micro pattern can be formed using the dry developing process.

In one embodiment, the present invention relates to a polymer which is suitable for use as a single layer photoresist, and preferably as a photoresist in the TSI process. Preferred photoresist polymers of the present invention are represented by the following Formula 1:

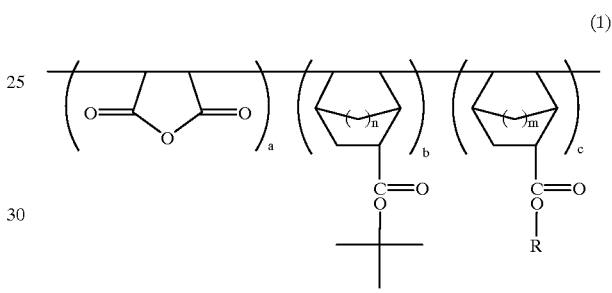

(1)

wherein, R is a $C_1$–$C_{10}$ primary or secondary alcohol group; m and n independently represent a number from 1 to 3; and the ratio of a:b:c is (10–100):(10–90):(10–90).

Another embodiment of the present invention relates to a preparation method for the polymer represented by the above Formula 1.

In still another embodiment, the present invention relates to a photoresist composition containing the polymer represented by the above Formula 1, a solvent, and a photoacid generator.

In a further embodiment, the present invention relates to a method of forming a micro pattern using the above-described photoresist composition.

DETAILED DESCRIPTION OF THE INVENTION

Figure 1A:
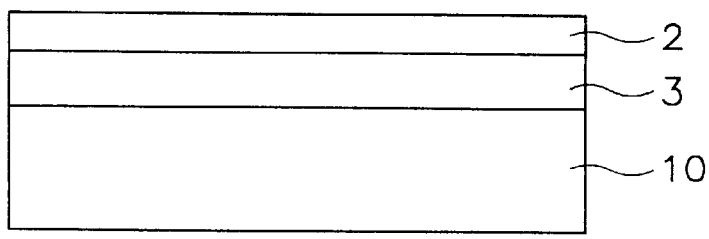
FIGS. 1a to 1f are schematic cross-sectional views showing a process for forming a photoresist pattern using a polymer of the present invention.
Figure 1B:
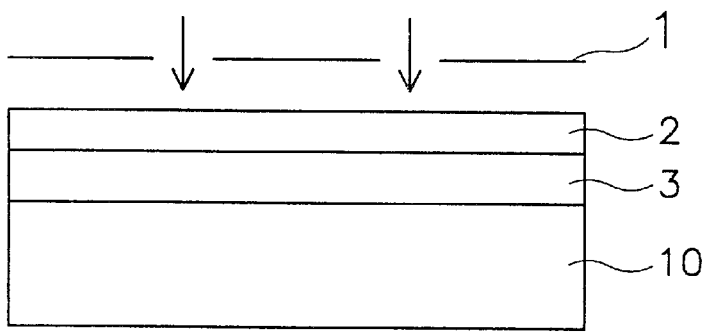
Figure 1C:
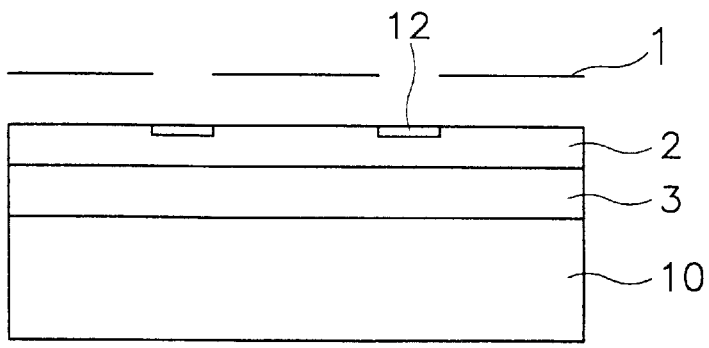
Figure 1D:
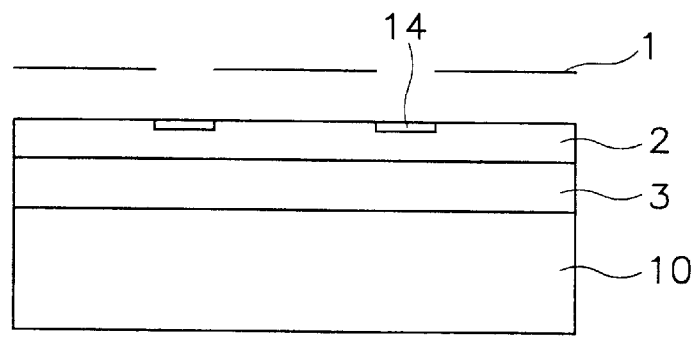
Figure 1E:
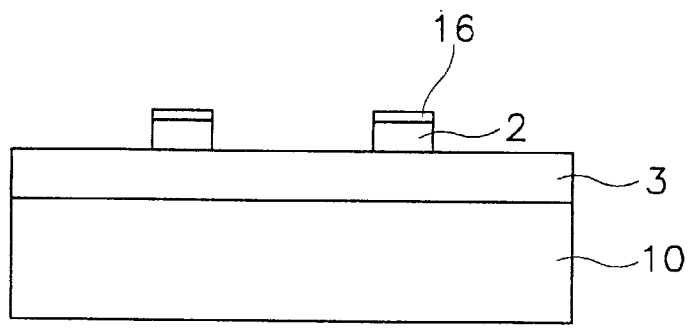
Figure 1F:
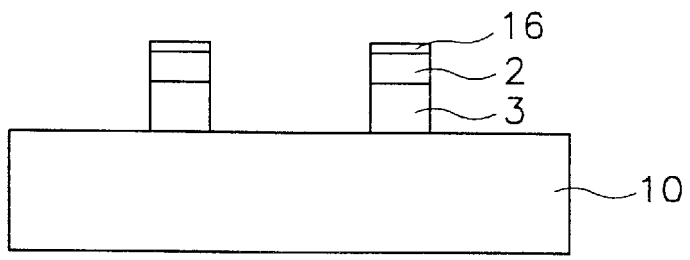

The polymer represented by Formula 1 above can be prepared according to the present invention by polymerizing the following three monomers in the presence of a polymerization initiator:

i) maleic anhydride (which is represented by Formula 2 below):

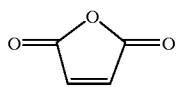

(2)

ii) a compound represented by the following Formula 3:

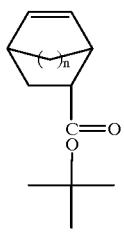

(3)

and iii) and a compound represented by following Formula 4:

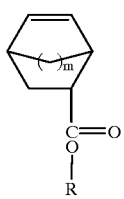

(4)

wherein, R is a $C_1$–$C_{10}$ primary, secondary or tertiary alcohol group; and m and n independently represent a number from 1 to 3.

Preferred compounds of Formula 3 are t-butyl 5-norbornene-2-carboxylate and t-butyl bicyclo[2,2,2]oct-5-ene-2-carboxylate.

Preferred compounds of Formula 4 are compounds in which R is a methyl alcohol, ethyl alcohol, propyl alcohol, butyl alcohol, or pentyl alcohol group. The most preferred compounds of Formula 4 are 2-hydroxyethyl 5-norbornene-2-carboxylate, 3-hydroxypropyl 5-norbornene-2-carboxylate, 2-hydroxyethyl-bicyclo [2,2,2]oct-5-ene-2-carboxylate, and 3-hydroxypropyl-bicyclo[2,2,2]oct-5-ene-2-carboxylate.

According to a preferred embodiment of the present invention, the compounds of Formula 2, Formula 3 and Formula 4 are reacted in a mole ratio of 1:(0.2–0.8): (0.2–0.8) respectively.

The polymers of the present invention can be manufactured at low cost, and with olefin copolymers that are easily combined using a conventional polymerization process such as bulk polymerization or solution polymerization. Benzoyl peroxide, 2,2-azobisisobutyronitrile (AIBN), acetyl peroxide, lauryl peroxide, or t-butyl peroxide can be used as a polymerization initiator. Tetrahydrofuran (THF), cyclohexane, methyl ethyl ketone, benzene, toluene, dioxane, or dimethyl formamide can be used as a polymerization solvent. The polymerization is typically carried out at a temperature between 60° C. and 80° C. in a nitrogen or an argon atmosphere for 5 to 25 hours. However, polymerization conditions are not limited to the above conditions.

The polymers of Formula 1, prepared according to the above polymerization process, are useful as photoresists for forming a micro pattern in the fabrication of a semiconductor element. According to the present invention, a photoresist composition can be prepared by mixing a polymer of Formula 1, a solvent, and a photoacid generator in a conventional manner. The photoacid generator is preferably a sulfur salt or onium salt which is selected from the group consisting of diphenyliodo hexafluorophosphate, diphenyliodo hexafluoroarsenate, diphenyliodo hexafluoroantimonate, diphenyl p-methoxyphenyl triflate, diphenyl p-toluenyl triflate, diphenyl p-isobutylphenyl triflate, diphenyl p-t-butylphenyl triflate, triphenylsulfonium hexafluorophosphate, triphenylsulfonium hexafluoroarsenate, triphenylsulfonium hexafluoroantimonate, triphenylsulfonium triflate, and dibutylnaphthyl sulfonium triflate. The photoacid generator is used in a quantity equal to about 1 to 20 wt % of the photoresist polymer used in the process. The sensitivity of the photoresist composition is insufficient at quantities of photoacid generator below 1 wt % and etching resistance is insufficient at quantities over 20 wt %. The solvent used in the composition may be conventional solvents such as methyl-3-methoxypropionate, ethyl-3-ethoxypropionate, propylene glycol methyl ether acetate. The solvent is used in a quantity equal to about 100 to 700 wt % of the polymer used in the process. The photoresist composition is preferably formed into a layer with a thickness of 0.3–3 μm.

The present invention also contemplates a method of forming a micro pattern using the above-described photoresist composition in a TSI process. Generally in this process, as illustrated in FIGS. 1a to 1f, a layer of the photoresist composition (2), which is coated on the upper part of etching layer (3) on the surface of a wafer (10), is first hardened by methods know in the art. A mask (1) is used to form exposed regions (12) on the hardened photoresist layer (2), and the photoresist is hardened again. Then, a silylation agent is sprayed on the element to form a silylation film (14) on the exposed areas. Silylation film (14) is subsequently developed by a dry developing process using $O_2$ plasma to form silicon oxide film (16). Etching layer (3) is then etched using the silicon oxide film (16) as an etching mask to form a pattern on etching layer (3).

The present invention is explained in more detail below, referring to the attached figures.

As stated, FIGS. 1a–f are cross-sectional views illustrating the method of forming a silylation photoresist pattern in a semiconductor element according to the present invention using the TSI process. After etching layer (3) and photoresist layer (2) are coated on the surface of wafer (10), the photoresist is baked at a temperature between 110° C. to 150° C. for 30 to 300 seconds in a first hardening step. Because the photoresist composition does not flow at high temperatures (150° C. to 190° C.) in silylation, it can form an ultra-micro pattern below 100 nm. The hardened photoresist layer (2) is exposed through mask (1) using a light source, such as ArF, EUV, an E-beam, or an ion-beam, having an exposing energy of 1–50 mJ/cm². After exposure, the photoresist is again baked at a temperature between 110°

C. and 150° C. for 30 to 300 seconds in a second hardening step. As a result, as illustrated in Reaction Foimula 1 below, the t-butyl group of the polymer is converted to a carboxylic acid group at the exposed regions through a diffusion of acids, and isobutene gas is discharged from the photoresist as a side product.

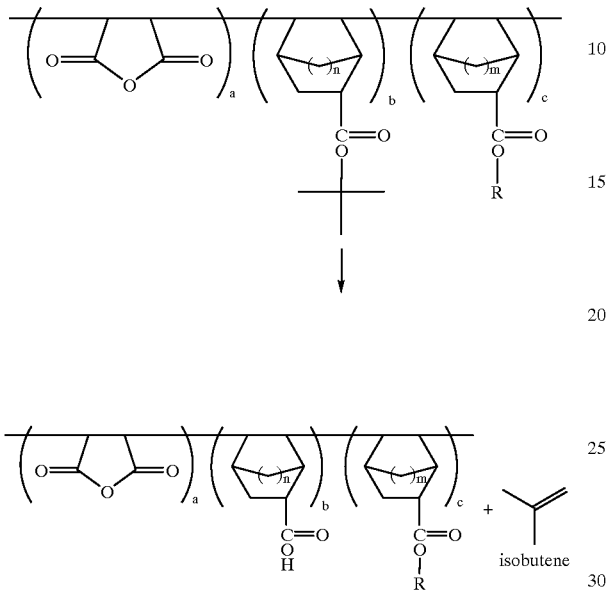

In a continuous silylation process, the discharge of isobutene allows the silylation agent to be easily permeated into the photoresist. Examples of suitable silylation agents for the practice of this invention are hexamethyldisilazane, tetramethyldisilazane, dimethylaminodimethylsilane, dimethylaminoethylsilane, dimethylsilyldimethylamine, trimethylsilyldimethylamine, trimethylsilyldiethylamine, dimethylaminopentamethylsilane, and the like. The most preferred silylation agent is hexmethyldisilazane (HMDS). The silylation process is preferably carried out at a temperature between 100° C. to 170° C. for 30 to 300 seconds.

Where the photoresist is used in the TSI process according to the present invention, the silylation reaction is facilitated by the carboxylic acid group formed on the photoresist polymer. This reaction principle is illustrated in Reaction Formula 2.

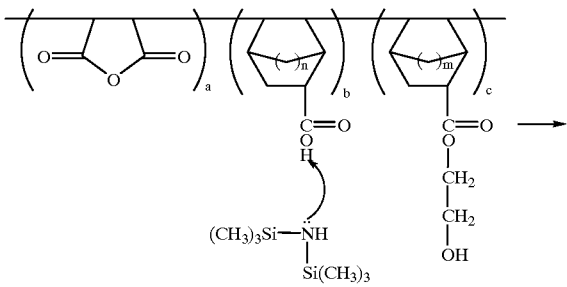

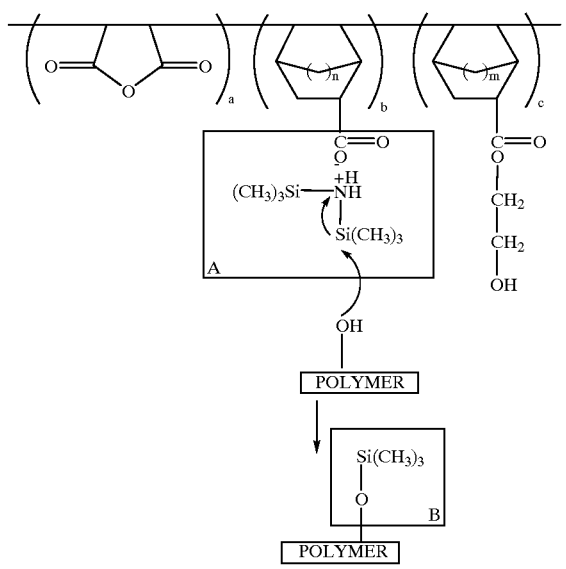

Silylation agents such as hexamethyldisilazane are a type of amine in which the silicon atom bound to the nitrogen atom has a powerful electron donating capacity, thereby making the silylation agent a strong base. For example, hexamethyldisilazane reacts with the carboxylic acid group generated in the exposed regions of the photoresist (2) in the silylation process to form the amine salt shown in Part A of Reaction Formula 2. This amine salt easily reacts with a hydroxy group of a polymer to form the Si—O bond shown in the Part B of Reaction Formula 2. However, because the carboxylic acid group is not generated in unexposed regions of the photoresist polymer, the reaction shown in Reaction Formula 2 does not occur therein. Furthermore, it is not easy for the hexamethyldisilazane to permeate into the photoresist and act as a silylation agent in unexposed regions because the photoresist hardens in those regions. When the photoresist is developed through a dry developing process using the $O_2$ plasma, the silicon bound to the polymer in the photoresist becomes a silicon oxide film which adheres to the wafer to form a pattern.

A better understanding of the present invention may be obtained by reference to the following examples which are set forth to illustrate, but not limit, the present invention.

PREPARATION EXAMPLE 1

Synthesis of poly (maleic anhydride/t-butyl 5-norbornene-2-carboxylate/2-hydroxyethyl 5-norbornene-2-carboxylate) polymer (Formula 5)

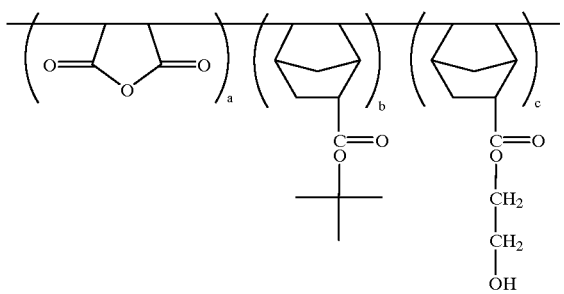

(5)

Figure 2:
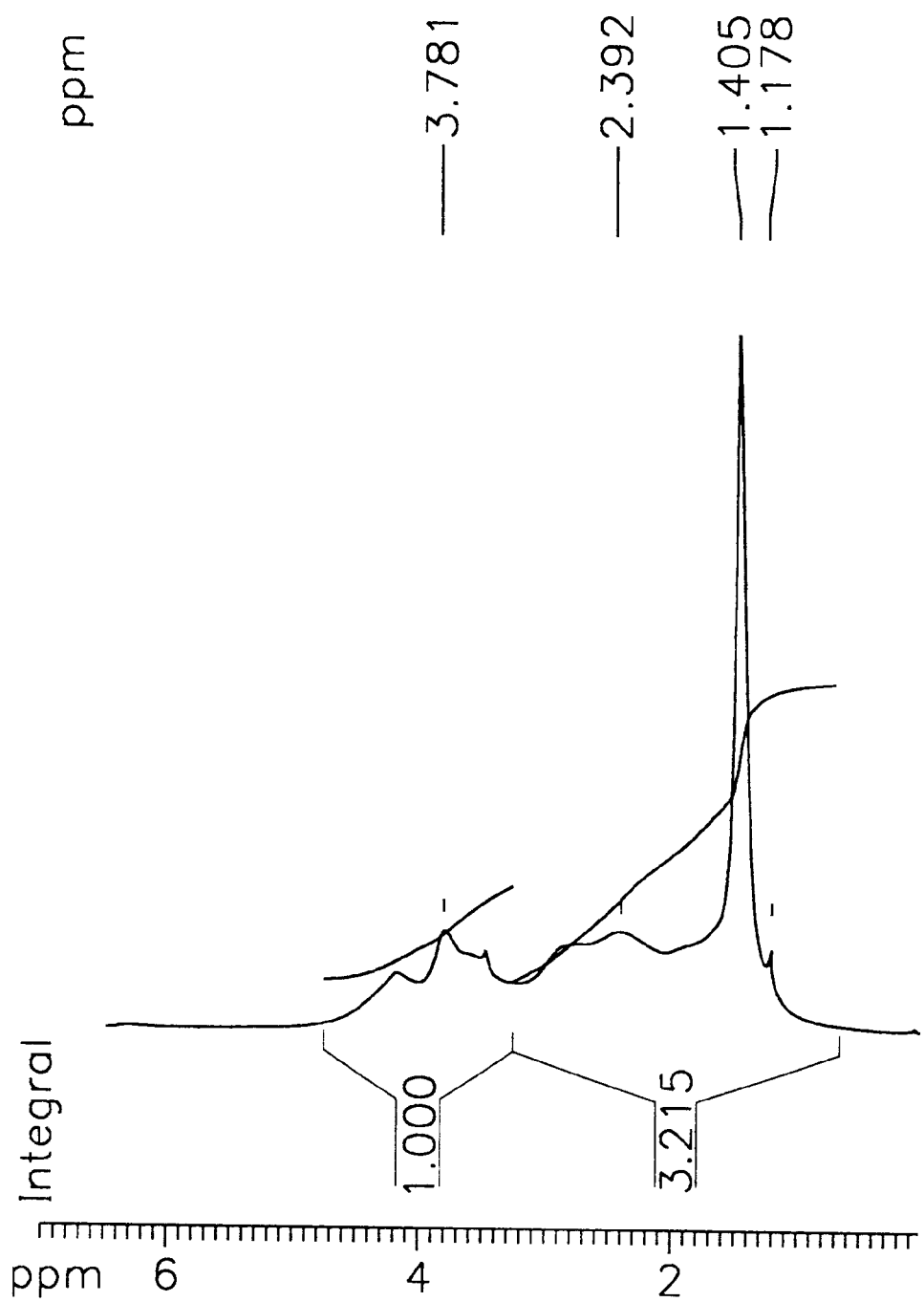
FIGS. 2 to 6 are NMR spectra of polymers of the present invention (represented by Formulas 5 to 9) prepared in the Preparation Examples herein.

Maleic anhydride (1 mol.), t-butyl 5-norbornene-2-carboxylate (0.5 mol.) and 2-hydroxyethyl 5-norbornene-2-carboxylate (0.5 mol) were dissolved in 220 gms of tetrahydrofuran (THF), 5.7 gms of 2,2'-azobisisobutyronitrile (AIBN) was added thereto, and the resulting solution was reacted at a temperature of 67° C. in a nitrogen atmosphere for 10 hours. After a high molecular weight was achieved by the reaction, the resultant product was precipitated in an ethyl ether solvent. The gathered precipitate was dried, and about 170 gms of the desired poly(maleic anhydride-butyl 5-norbornene-2-carboxylate/2-hydroxyethyl 5-norbornene-2-carboxylate) polymer was obtained at a yield of about 60%. NMR spectra of the polymer is illustrated in FIG. 2.

PREPARATION EXAMPLE 2

Synthesis of poly(maleic anhydride/t-butyl 5-norbornene-2-carboxylate/3-hydroxy propyl 5-norbornene-2-carboxylate) polymer (Formula 6)

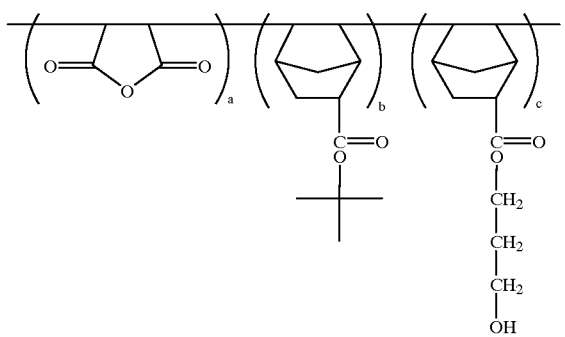

(6)

Figure 3:
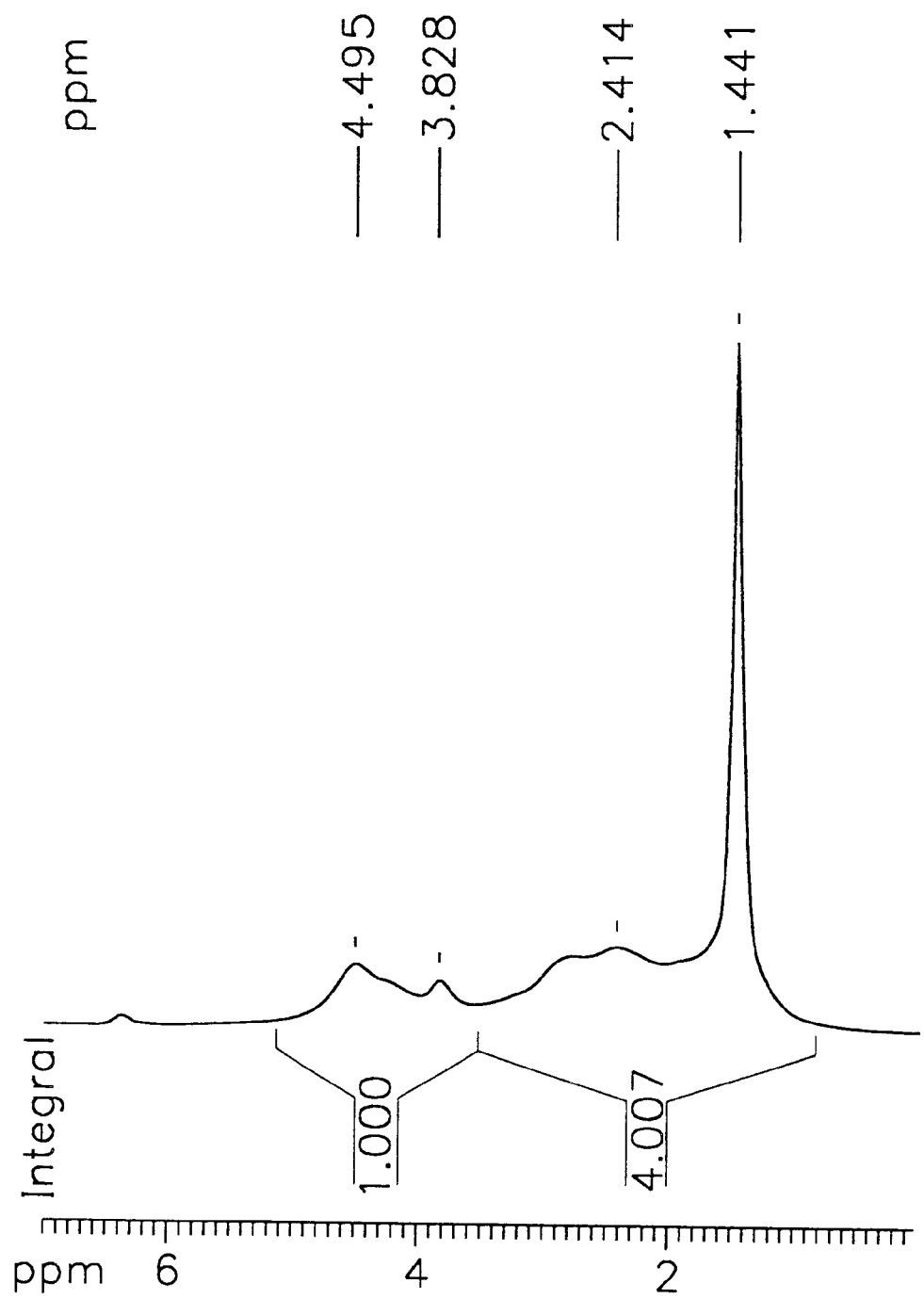

Maleic anhydride (1 mol.), t-butyl 5-norbornene-2-carboxylate (0.5 mol.), and 3-hydroxy propyl 5-norbornene-2-carboxylate (0.5 mol.) were dissolved in 200 gms. of tetrahydrofuran (THF), 6 gms. of 2,2'-azobisisobutyronitrile (AIBN) were added thereto, then the resultant solution was reacted at a temperature of 67° C. in a nitrogen atmosphere for 10 hours. After a high molecular weight was achieved by the reaction, the resultant product was precipitated in an ethyl ether solvent. The gathered precipitate was dried, and about 167 grams of the desired poly (maleic anhydride/t-butyl 5-norbornene-2-carboxylate/3-hydroxypropyl 5-norbornene-2-carboxylate) polymer was obtained at a yield of about 57%. NMR spectra of the polymer is illustrated in FIG. 3.

PREPARATION EXAMPLE 3

Synthesis of poly (maleic auhydridelt-butyl bicyclo [2,2,2]oct-5-ene2-carboxylate/2-hydroxyethyl 5-norbornene-2-carboxylate) polymer (Formula 7)

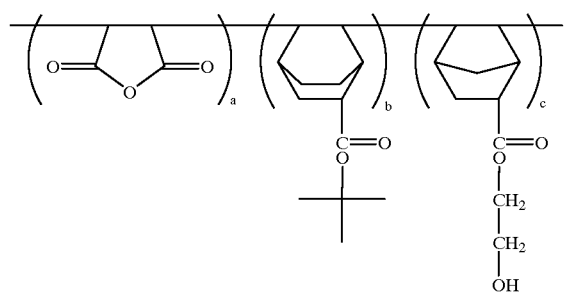

(7)

Figure 4:
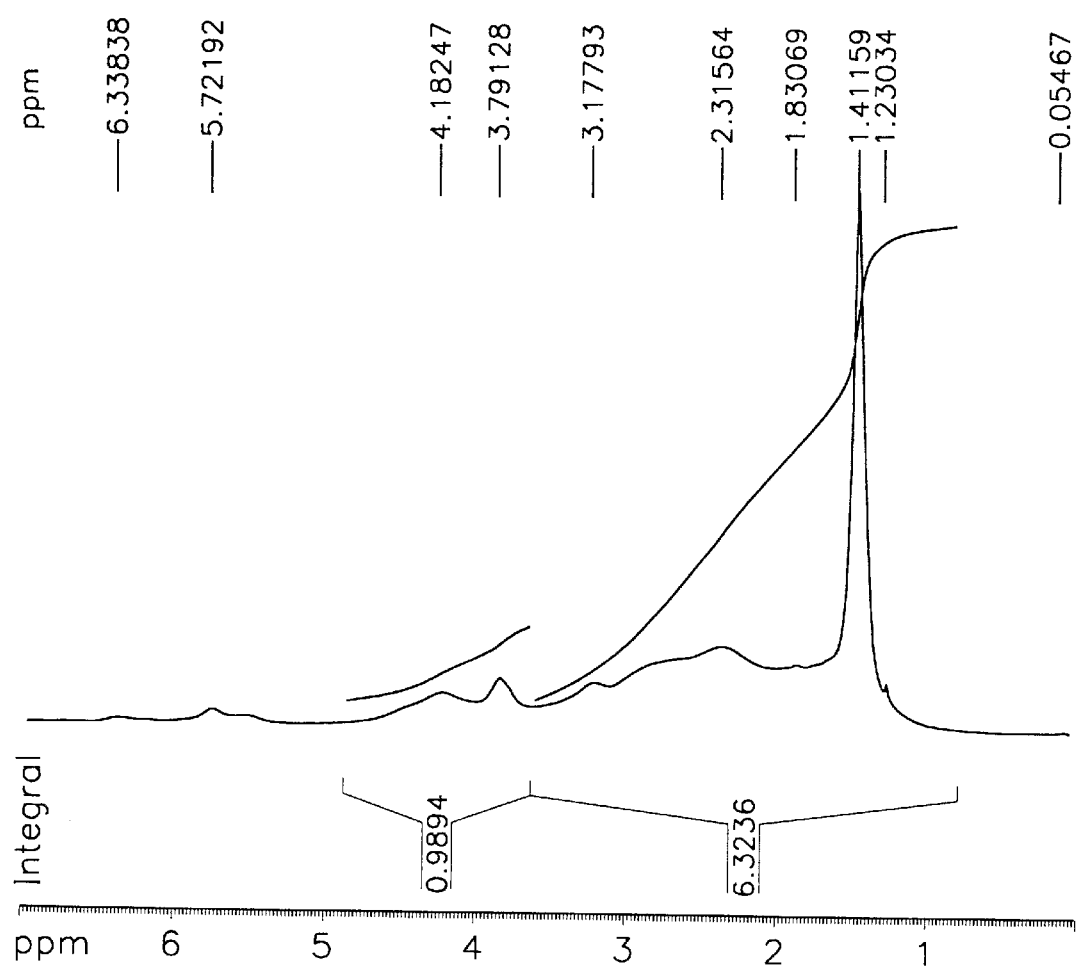

Maleic anhydride 1 mol, t-butyl bicyclo[2,2,2]oct-5-ene-2-carboxylate (0.5 mol.), and 2-hydroxyethyl 5-norbornene-2-carboxylate (0.5 mol.) were dissolved in 200 gms of tetrahydrofuran (THF), 6 gms of 2,2'-azobisisobutyronitrile (AIBN) was added thereto, and then the resultant solution was reacted at a temperature of 67° C. in a nitrogen atmosphere for 10 hours. After a high molecule weight was achieved by the reaction, the resultant product was precipitated in a hexane solvent. The gathered precipitate was dried, and 146 gms of the desired poly(maleic anhydride/t-butyl bicyclo[2,2,2]oct-5-ene-2-carboxylate/2-hydroxyethyl 5-norbornene-2-carboxylate) polymer was obtained at a yield of 50%. NMR spectra of the polymer is illustrated in FIG. 4.

PREPARATION EXAMPLE 4

Synthesis of poly(maleic anhydride/t-butyl bicyclo[2,2,2]oct-5-ene2-carboxylate/3-hydroxypropyl 5norbornene2-carboxylate) polymer (Formula 8)

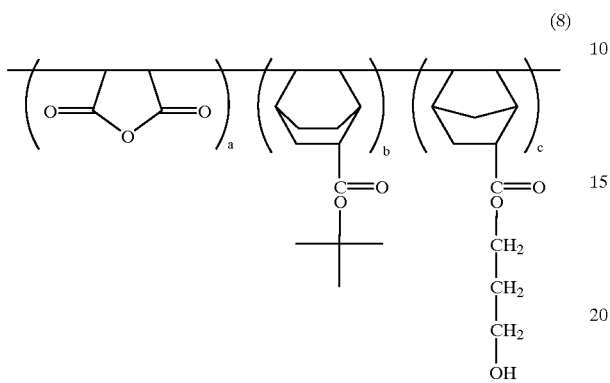

(8)

Figure 5:
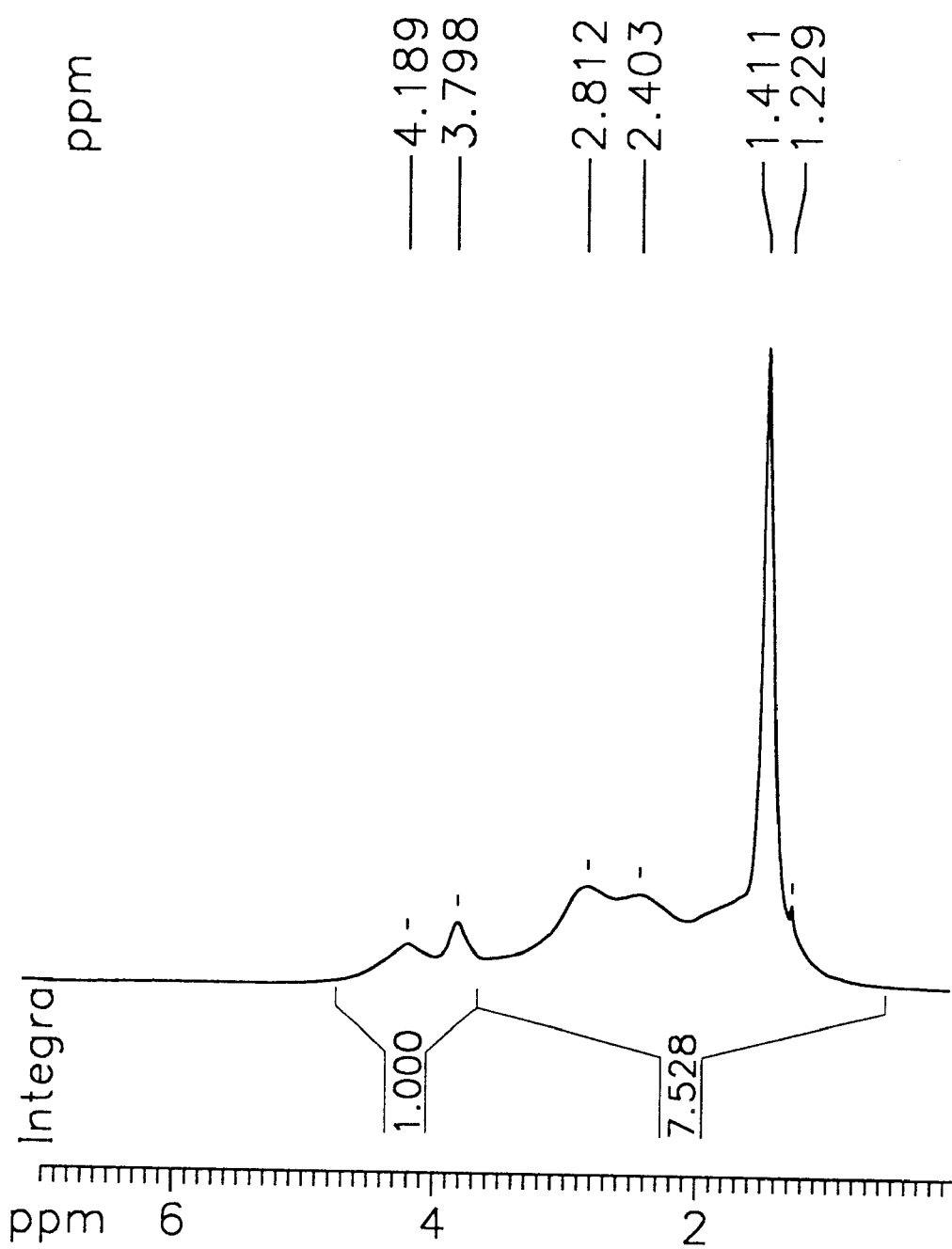

Maleic anhydride (1 mol.), t-butyl bicyclo[2,2,2]oct-5-ene-2-carboxylate (0.5 mol.), and 3-hydroxy propyl 5-norbornene-2-carboxylate (0.5 mol.) were dissolved in 200 gms of tetrahydrofuran (THF), 6 gms of 2,2'-azobisisobutyronitrile (AIBN) was added thereto, and then the resultant solution was reacted at a temperature of 67° C. in a nitrogen atmosphere for 10 hours. After a high molecule weight was achieved by the reaction, the resultant product was precipitated in an ethyl ether solvent. The gathered precipitate was dried, and 150 gms of the desirable poly(maleic anhydride/t-butyl bicyclo[2,2,2]oct-5-ene-2-carboxylate/3-hydroxypropyl 5-norbornene-2-carboxylate) polymer was obtained at a yield of about 50%. NMR spectra of the polymer is illustrated in FIG. 5.

PREPARATION EXAMPLE 5

Synthesis of poly(maleic anhydride-butyl 5-norbornene-2-carboxylate l2-hydroxyethyl bicyclo[2,2,2]oct-5-ene-2-carboxylate) polymer (Formula 9)

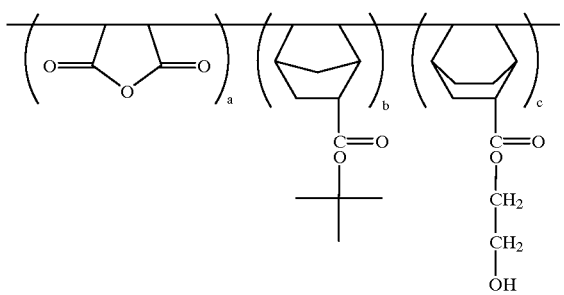

(9)

Figure 6:
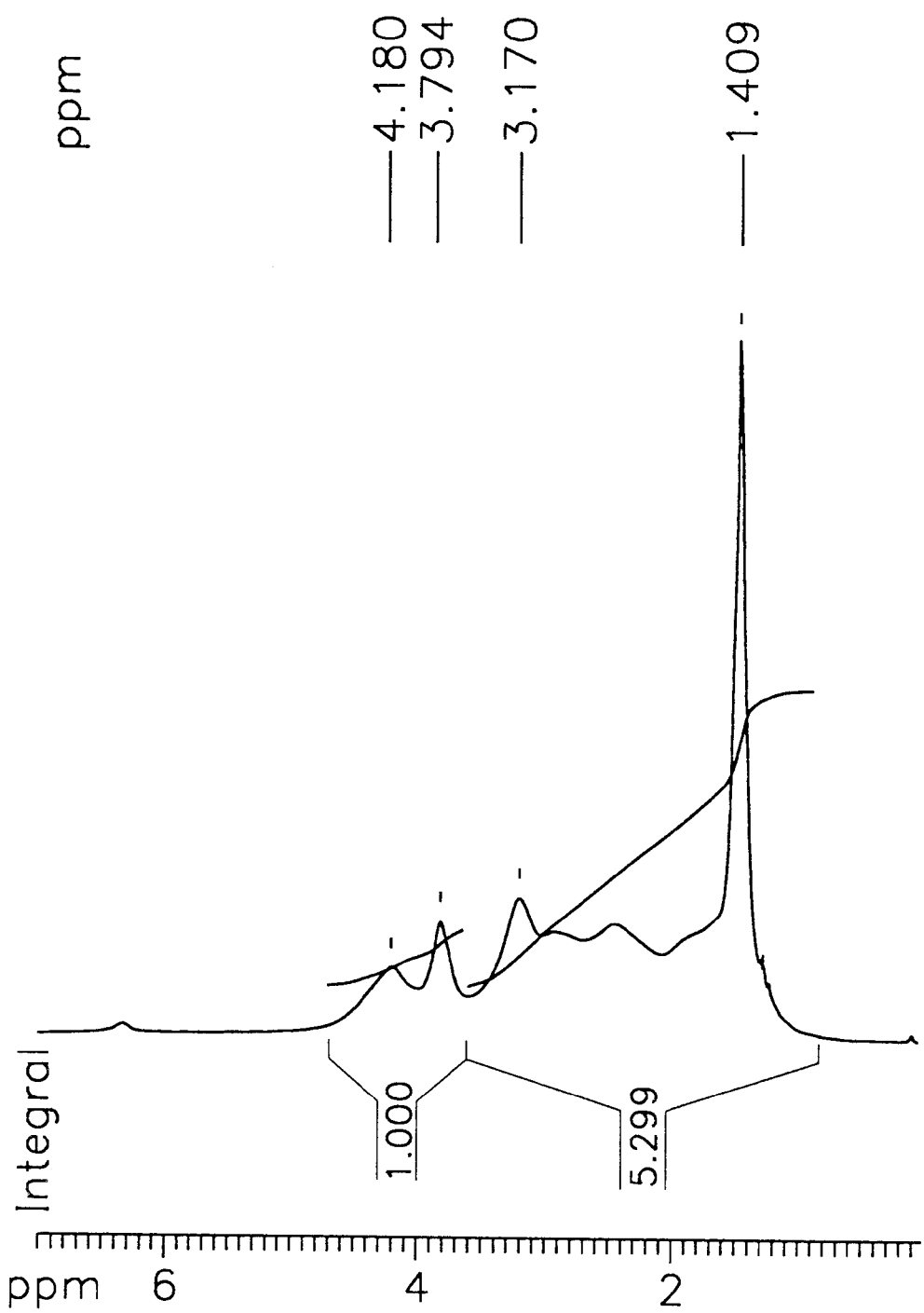

Maleic anhydride (1 mol.), t-butyl 5-norbornene-2-carboxylate (0.5 mol.) and 2-hydroxy ethyl bicyclo[2,2,2] oct-5-ene-2-carboxylate (0.5 mol.) were dissolved in 200 gms of tetrahydrofuran (THF), 6 gms of 2,2'-azobisisobutyronitrile (AIBN) was added thereto, then the resultant solution was reacted at a temperature of 67° C. in a nitrogen atmosphere for 10 hours. After a high molecule weight was achieved by the reaction, the resultant product was precipitated in an ethyl ether solvent. The gathered precipitate was dried, and 150 gms of the desired poly(maleic anhydride/t-butyl 5-norbornene-2-carboxylate/2-hydroxyethyl bicyclo[2,2,2]oct-5-ene-2-carboxylate) polymer was obtained at a yield of about 51%. NMR spectra of the polymer is illustrated in FIG. 6.

PREPARATION EXAMPLE 6

Synthesis of poly(maleic anhydride/t-butyl 5-norbornene-2-carboxylate/3-hydroxy propyl bicyclol [2,2,2]oct-5ene-2-carboxylate) polymer (Formula 10)

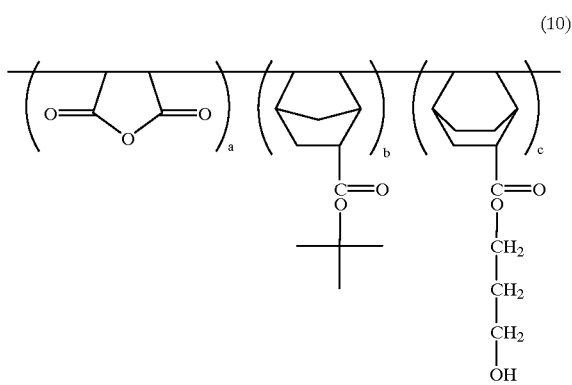

(10)

Maleic anhydride (1 mol.), t-butyl 5-norbornene-2-carboxylate (0.5 mol.) and 3-hydroxypropylbicyclo[2,2,2]oct-5-ene-2-carboxylate (0.5 mol.) were dissolved in 200 gms of tetrahydrofuran (THF), 6 gms of 2,2'-azobisisobutyronitrile (AIBN) was added thereto, then the resultant solution was reacted at a temperature between 60° C. and 70° C. in a nitrogen atnosphere for 10 hours. After a high molecule weight was achieved by the reaction, the resultant product was precipitated in an ethyl ether solvent. The gathered precipitate was dried, and 168 gms of the desired poly(maleic anhydride-butyl 5-norbornene-2-carboxylate/3-hydoxyproply bicyclo[2,2,2]oct-5-ene-2-carboxylate) polymer was obtained at a yield of about 56%.

PREPARATION EXAMPLE 7

Synthesis of poly (maleic anhydride-butyl bicyclo[2,2,2]oct-5-ene2-carboxylate/2-hydroxyethyl bicydo[2,2,2]-5-ene-2-carboxylate)polymer (Formula 11)

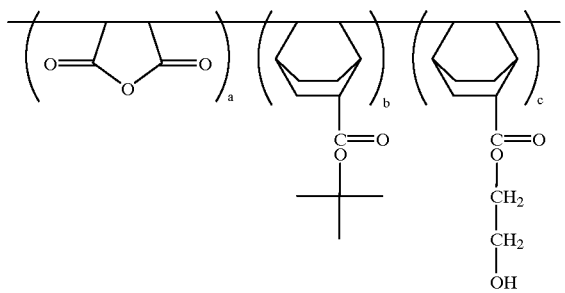

(11)

Maleic anhydride (1 mol.), t-butyl bicyclo[2,2,2]oct-5-ene-2-carboxylate (0.5 mol.), and 2-hydroxyethyl bicyclo[2,2,2]oct-5-ened-2-carboxylate (0.5 mol.) were dissolved in 200 gms of tetrrhydrofuran (THF), 6 gms of 2,2'-azobisisobutyronitrile (AIBN) was added thereto, then the resultant solution was reacted at a temperature of 67° C. in a nitrogen atmosphere for 10 hours. After a high molecular weight was achieved by the reaction, the resultant product was precipitated in an ethyl ether solvent. The gathered precipitate was dried, and 156 gms of the desired poly (maleic anhydride/t-butyl bicyclo[2,2,2]oct-5-ene-2-carboxylate/2-hydroxyethyl bicyclo[2,2,2]oct-5-ene-2-carboxylate) polymer was obtained at a yield of about 52%.

PREPARATION EXAMPLE 8

Synthesis of poly(maleic anhydrideIt-butyl bicyclo[2,2,2]oct-5-ene-2-carboxylate/3-hydroxypropyl bicyclol[2,2,2]oct-5-ene-2-carboxylate) polymer (Formula 12)

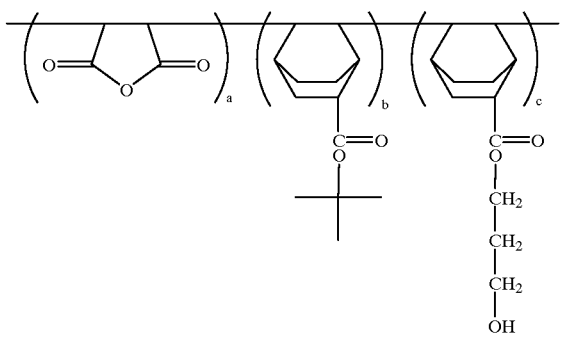

(12)

Maleic anhydride (1 mol.), t-butyl bicyclo[2,2,2]oct-5-ene-2-carboxylate (0.5 mol.), and 3-hydroxypropyl bicyclo[2,2,2]oct-5-ene-2-carboxylate (0.5 mol.) were dissolved in 200 gins of tetrahydrofuran (THF), 6 gms of 2,2'-azobisisobutyronitrile (AIBN) was added thereto, then the resultant solution was reacted at a temperature of 67° C. in a nitrogen atmosphere for 10 hours. After a high molecular weight was achievd by reaction, the resultant product was precipitated in an ethyl ether solvent, then the gathered precipitate was dried, and 150 gms of the desired poly (maleic anhydride/t-butyl bicyclo[2,2,2]oct-5-ene-2-carboxylate/3-hydroxypropyl bicyclo[2,2,2]oct-5-ene-2-carboxylate) polymer was obtained ata yield of about 49%.

EXAMPLE 1

Preparation of Photoresist Composition and Forming of Pattern 10 gms of poly (maleic anhydride/t-butyl 5-norbornene-2-carboxylate/2-hydroxy ethyl 5-norbornene-2-carboxylate), prepared according to Preparation Example 1, were dissolved in 40 gms of ethyl 3-ethoxypropionate as a solvent, and 0.4 gms of triphenylsulfonium triflate were added thereto. Then the resultant solution was filtered through filter of 0.10 μm to prepare a photoresist composition.

Figure 7:
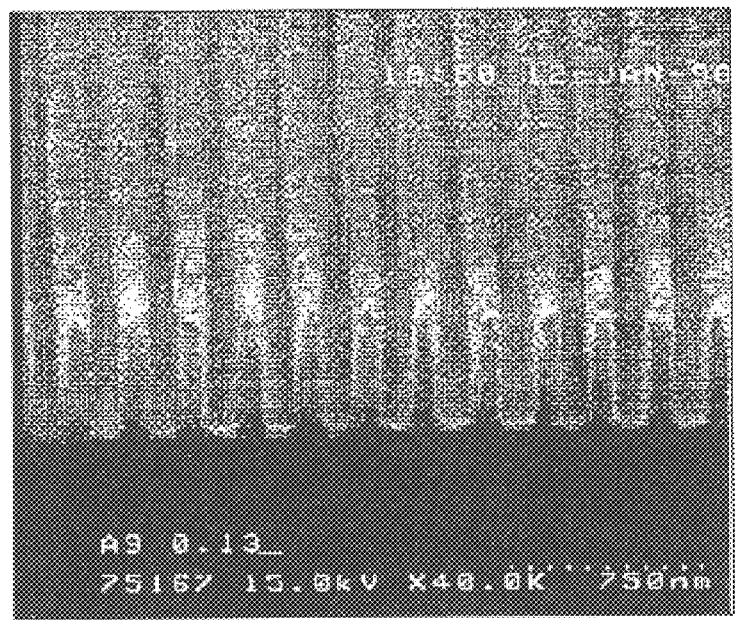
FIGS. 7 to 14 are SEM micrographs showing the appearance of photoresist patterns formed according to the present invention.

Referring to FIGS. 1a to 1f, an etching layer (3) was formed on a surface of a wafer (10), the photoresist composition prepared above was coated on the etching layer (3), and the wafer was hardened to form a photoresist layer (2) (the first hardening step). In this case, the photoresist composition was hardened by baking at 150° C. for 120 seconds after coating. Subsequently, the hardened photoresist layer (2) was exposed to an exposing mask using an ArF light source. In this case, an exposing energy of 8 mJ/cm² was used. After exposure, the wafer was baked at 130° C. for 90 seconds. Subsequently, hexarnethyldisilazane was sprayed at 170° C. for 150 seconds on the photoresist layer (2) to form a silylation layer (16). Then, a dry etching process using O₂ plasma was performed. A pattern of the exposed regions remained, but the photoresist layer (2) of the unexposed regions was removed. As a result, a photoresist pattern was obtained, as illustrated in FIG. 7. As shown therein, a micro pattern having a high resolution (0.13 μm) was obtained using a low level of exposing energy and an ultra short wave light source (ArF: 193 nm).

EXAMPLE 2

Preparation of Photoresist Composition and Forming of Pattern

Figure 8:
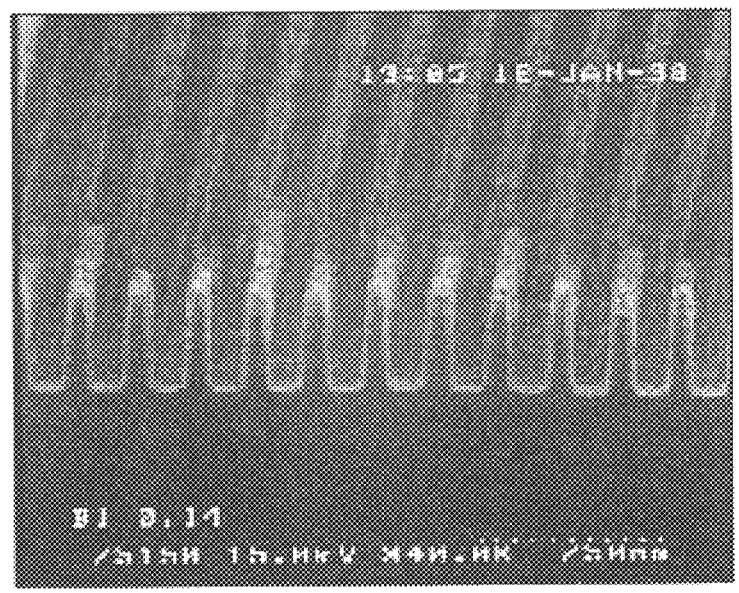

According to the method of Example 1 above, the photoresist pattern shown in FIG. 8 (resolution 0.14 μm) was obtained using 10 gms of the poly(maleic anhydride/t-butyl 5-norbornene-2-carboxylate/3-hydroxypropyl 5-norbornene-2-carboxylate) prepared according to Preparation Example 2.

EXAMPLE 3

Preparation of Photoresist Composition and Forming of Pattern

Figure 9:
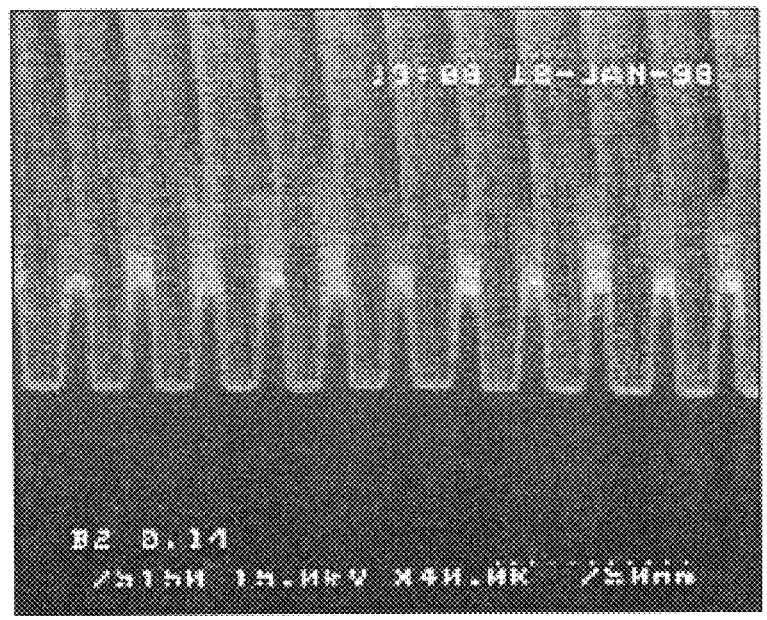

According to the method of Example 1 above, the photoresist pattern shown in FIG. 9 (resolution 0.14 μm) was obtained using 10 gms of the poly(maleic anhydride/t-butyl bicyclo[2,2,2]oct-5-ene-2-carboxylate/2-hydroxy ethyl 5-norbornene-2-carboxylate) prepared according to Preparation Example 3.

EXAMPLE 4

Preparation of Photoresist Composition and Forming of Pattern

Figure 10:
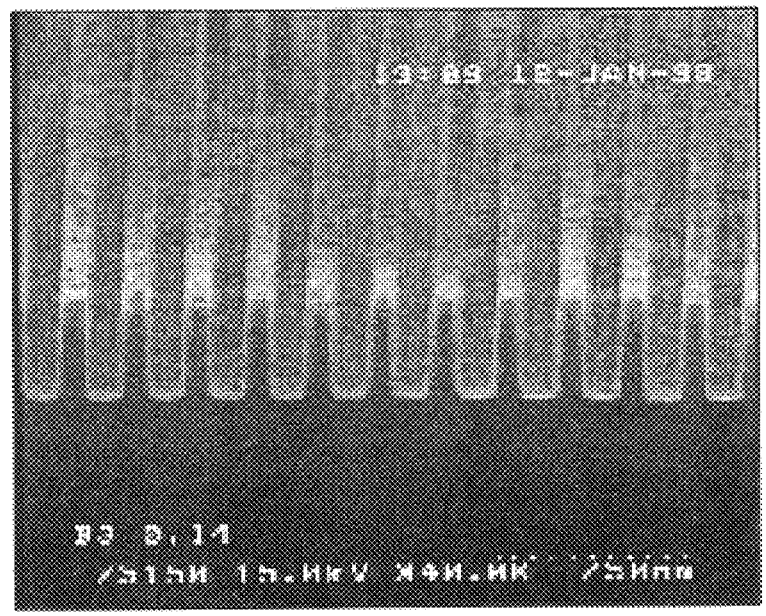

According to the method of Example 1 above, the photoresist pattern shown in FIG. 10 (resolution 0.14 μm) was obtained using 10 gms of the poly(maleic anhydridelt-butyl bicyclo[2,2,2]oct-5-ene-2-arboxylate/3-hydroxypropyl 5-norbornene-2-carboxylate) prepared according to Preparation Example 4.

EXAMPLE 5

Preparation of Photoresist Composition and Forming of Pattern

Figure 11:
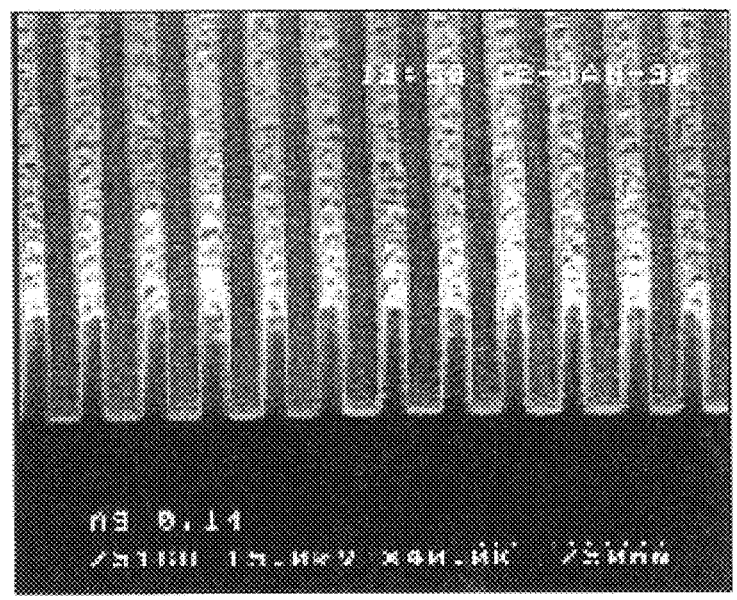

According to the method of Example 1 above, the photoresist pattern shown in FIG. 11 (resolution 0.14 μm) was obtained using 10 gms of the poly (maleic anhydride/t-butyl 5-norbornene-2-carboxylate/2-hydroxyethyl bicyclo[2,2,2] oct-5-ene-2-carboxylate) prepared according to Preparation Example 5 (10 g).

EXAMPLE 6

Preparation of Photoresist Composition and Forming of Pattern

Figure 12:
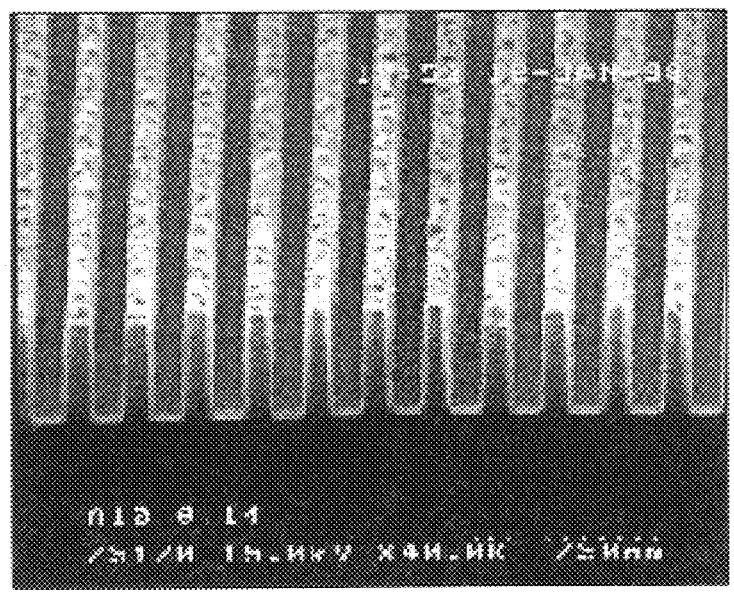

According to the method of Example 1, the photoresist pattern shown in FIG. 12 (resolution 0.14 μm) was obtained using 10 gms of the poly (maleic anhydride/t-butyl 5-norbomene-2-carboxylate/3-hydroxypropyl bicyclo[2,2,2]oct-5-ene-2-carboxylate) prepared according to Preparation Example 6.

EXAMPLE 7

Preparation of Photoresist Composition and Forming of Pattern

Figure 13:
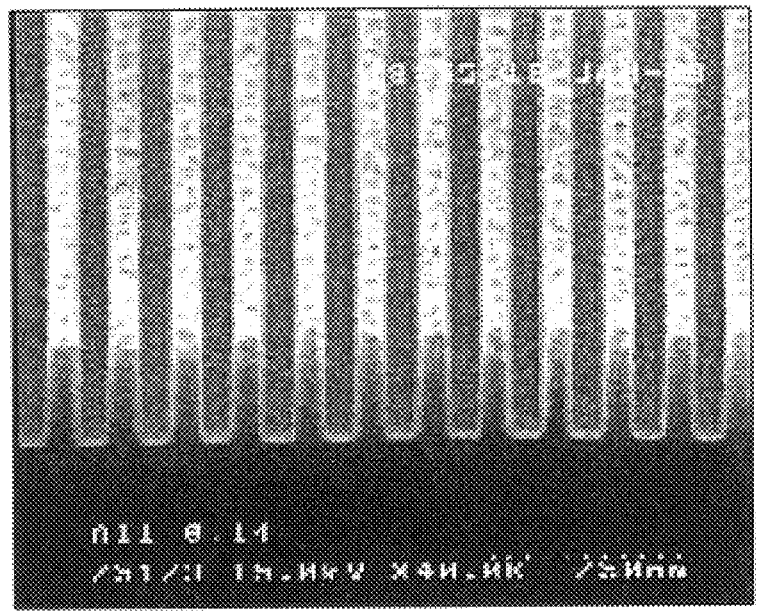

According to the method of Example 1, the photoresist pattern shown in FIG. 13 (resolution 0.14 μm) was obtained using 10 gms of the poly(maleic anhydride/t-butyl bicyclo [2,2,2]oct-5-ene-2-arboxylate/2-hydroxyethyl bicyclo[2,2,2]oct-5-ene-2-carboxylate) prepared according to Preparation Example 7.

EXAMPLE 8

Preparation of Photoresist Composition and Forming of Pattern

Figure 14:
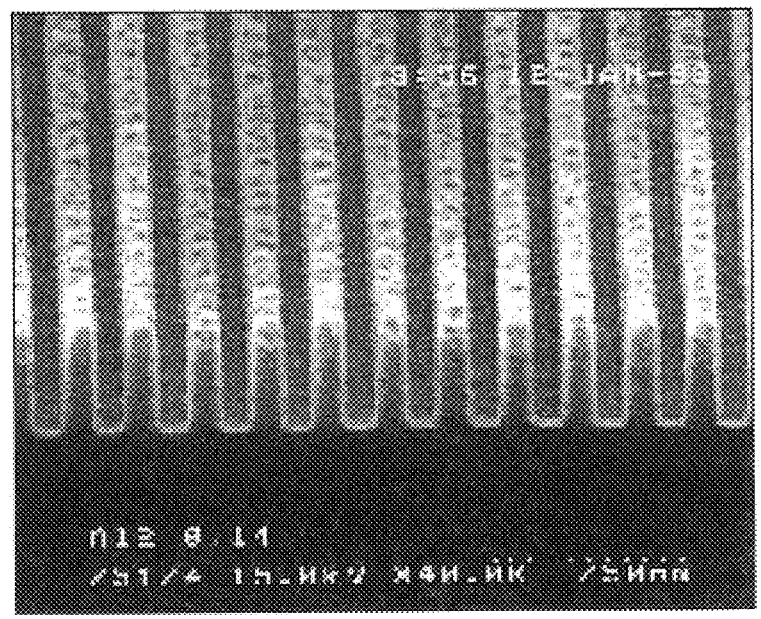

According to the method of Example 1, the photoresist pattern shown in FIG. 14 (resolution 0.14 μm) was obtained using 10 gms of the poly (maleic anhydride/t-butyl bicyclo [2,2,2]oct-5-ene-2-carboxylate/3-hydroxy propyl bicyclo[2,2,2]oct-5-ene-2-carboxylate) prepared according to Preparation Example 8.

As described above, an ArF photoresist is provided in accordance with the present invention which has heat resistance sufficient to endure the post-baking and silylation processes which are carried out at a high temperature in the TSI process. Also, the pattern using a chemically amplified photoresist of the present invention is resolved through the usage of a small energy level of 10 mJ/cm² thereby preventing the damage that occurs to the lens of an exposer when an ArF light source is used. When $O_2$ plasma is used in the silylation process with a polymer of the present invention, a silicon oxide film is formed thereby increasing etching resistance and heat resistance of the photoresist. Thus, a micro pattern can be formed through the dry developing process and high integration of a semiconductor element is possible through the use of a photoresist employing a polymer of the present invention.

Other features, such as other advantages and embodiments, of the invention disclosed herein will be readily apparent to those of ordinary skill in the art after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method of forming a photoresist pattern, comprising the steps of:

a) preparing a photoresist composition comprising:
      (i) a photoresist polymer of Formula 1:

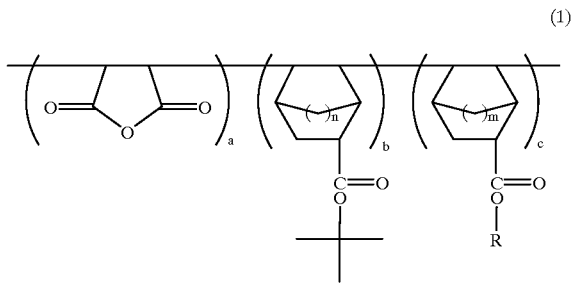

wherein, R is a $C_1$–$C_{10}$ primary or secondary alcohol group; m and n independently represent a number from 1 to 3; and a, b and c are the respective polymerization ratios of the co-monomers; wherein each of a:b:c: is greater than 0 and represent polymerization ratios of the co-monomers.

(ii) a photoacid generator, and,
      (iii) an organic solvent.

b) coating the photoresist composition on a substrate having an etching layer coated on the surface thereof;

c) exposing the photoresist layer to a light source using an exposer to form a pattern of exposed regions in the photoresist layer wherein the photoresist polymer contains free carboxylic acid groups;

d) spraying a silylation agent on the pattern in photoresist layer;

e) dry etching the resultant pattern to form a pattern in the substrate.

2. A method of forming a photoresist pattern in accordance with claim 1, wherein a process illustrated by following Reaction Formula 2 is carried out as a result of the d) step.

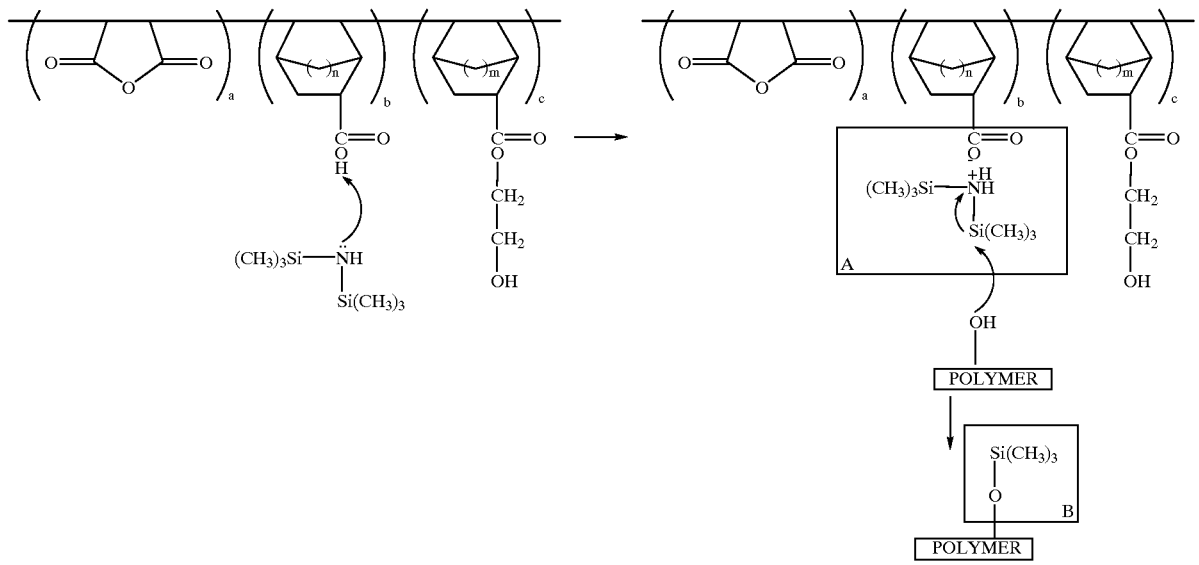

wherein each of a:b:c: is greater then 0 and represent polymerization ratios of the co-monomers.

3. A method of forming a photoresist pattern in accordance with claim 1, which further comprises abaking step before and/or after the (c) step, wherein the baking is carried out at 110° C. to 150° C. for 30 to 300 seconds.

4. A method of forming a photoresist pattern in accordance with claim 1, wherein the (c) step is carried out by using an ArF, EUV, E-beam, ion-bearn, or X-ray light source.

5. A method of forming a photoresist pattern in accordance with claim 1, wherein the (c) step is carried out using irradiating energy of 1–50 mJ/cm$^2$.

6. A method of forming a photoresist pattern in accordance with claim 1, wherein the silylation agent is selected from the group consisting of hexamethyldisilazane, tetramethyldisiazane, dimethylaminomethylsilane, dimethylaaminomethylsilane, dimethylsilyldimethylamine, trimethylsilyldimethylamine, trimethylsilyldiethylamine and dimethylaminopentamethylsilane.

7. A method of forming a photoresist pattern in accordance with claim 1, wherein the (d) step is carried out at 100° C. to 170° C. for 30 to 300 seconds.

* * * * *